US 6,702,000 B2

(12) United States Patent
Miyahara et al.

(10) Patent No.: US 6,702,000 B2
(45) Date of Patent: Mar. 9, 2004

(54) HEAT SINK APPARATUS, BLOWER FOR USE THEREIN AND ELECTRONIC EQUIPMENT USING THE SAME APPARATUS

(75) Inventors: Masaharu Miyahara, Nakatsu (JP); Koji Mehara, Usa (JP); Kenji Suga, Nakatsu (JP); Kazuya Shibasaki, Ome (JP); Hiroshi Nakamura, Ome (JP); Hironori Ito, Ome (JP)

(73) Assignees: Matsushita Electric Industrial Co., Ltd., Osaka (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/925,508

(22) Filed: Aug. 10, 2001

(65) Prior Publication Data

US 2002/0000308 A1 Jan. 3, 2002

Related U.S. Application Data

(62) Division of application No. 08/624,990, filed on Mar. 29, 1996, now Pat. No. 6,315,031.

(30) Foreign Application Priority Data

Mar. 31, 1995 (JP) ............................................. 7-074764

(51) Int. Cl.$^7$ ............................. H05K 7/20; F01D 25/12
(52) U.S. Cl. .................... 165/80.3; 165/121; 165/122; 415/177; 415/220; 415/229; 417/373; 417/423.14; 417/423.15
(58) Field of Search ................................ 165/121, 80.3, 165/185, 122; 361/697; 415/177, 220, 229; 417/423.14, 423.15, 373

(56) References Cited

U.S. PATENT DOCUMENTS

| 4,831,294 A | | 5/1989 | Jussila |
| 5,079,438 A | | 1/1992 | Heung |
| 5,164,884 A | | 11/1992 | Pesola |
| 5,272,599 A | | 12/1993 | Koenen |
| 5,297,617 A | | 3/1994 | Herbert ..................... 165/80.3 |
| 5,299,632 A | * | 4/1994 | Lee ........................... 165/80.3 |
| 5,370,178 A | | 12/1994 | Agonafer et al. |
| 5,390,734 A | | 2/1995 | Voorhes et al. |
| 5,406,451 A | | 4/1995 | Korinsky |
| 5,478,221 A | | 12/1995 | Loya |
| 5,731,952 A | | 3/1998 | Ohgami et al. |

* cited by examiner

Primary Examiner—Leonard Leo
(74) Attorney, Agent, or Firm—Stevens, Davis, Miller & Mosher, LLP

(57) ABSTRACT

A blower is provided for effectively cooling heat generating parts in a casing of a personal computer and so on, with a heat sink apparatus using the blower and an electronic equipment using the heat sink apparatus. The blower comprises a fan and an outer frame. The outer frame of the fan is made of a highly thermally conductive material such as aluminum. A radiation board is fixed to or formed integrally with a lower surface of the outer frame. Heat generated from a heat generating device is conveyed through the radiation board to the outer frame. The blower is provided with radiation fins so that the heat conveyed to the outer frame is transferred to the radiation fins as well.

18 Claims, 4 Drawing Sheets

HEAT SINK APPARATUS, BLOWER FOR USE THEREIN AND ELECTRONIC EQUIPMENT USING THE SAME APPARATUS

This is a divisional of application Ser. No. 08/624,990 filed Mar. 29, 1996 , now U.S. Pat. No. 6,315,031.

FIELD OF THE INVENTION

This invention relates to a blower for cooling heat generating parts in a casing of an electronic equipment such as a computer of desk-top type or portable or mobile type, and to a heat sink apparatus using the same blower.

DESCRIPTION OF THE RELATED ART

Followed by the recent tendency to large-scale integration and expedition, the amount of heat generated by the semiconductor such as a micro-processor unit (hereinafter, referred to as MPU) is increasing. In a personal computer and the like incorporating the MPU which generates a large amount of heat, there have been made various attempts such as to mount a heat sink for radiating heat or a heat sink having a built-in fan motor on an upper surface of the MPU for the purpose of suppressing a temperature rise in a casing.

FIG. 6 shows a dimensional relationship in a case where a heat sink having a built-in fan motor is mounted on an upper surface of the MPU. When the thicknesses of an MPU 71, a printed circuit board 72 and a heat sink 73 having a built-in fan motor are 6 mm, 2 mm and 18 mm respectively, the overall thickness is 26 mm in total. Considering suction of air by the fan motor and insulation of the back of the printed circuit board, there is needed a space of at least 40 mm or so.

In an electronic equipment such as a notebook personal computer or the like, which is required to be thin, an interior space is limited to 30 mm. For this reason, it is impossible to insure an ample space above the upper surface of the MPU on the printed circuit board, and therefore it is impossible to mount a heat sink having a built-in fan motor on the upper surface of the MPU, giving rise to a problem in thermal design.

Meanwhile, in a desk-top personal computer, it is possible to insure a space above the upper surface of the MPU on the printed circuit board, however, there are needed to fan motors for a fan on the MPU and for another fan for exhaust of air from the casing, giving rise to a problem in cost.

SUMMARY OF THE INVENTION

In view of the above problems, a heat sink apparatus according to the present invention has a thermally conductive outer frame having a fan disposed in an opening thereof, the outer frame being mounted at one end of a heat conduction member for conducting heat of a heat generating device so as to conduct the heat to the vicinity of the fan to cool the heat generating device. Further, there is provided a heat sink apparatus of the invention that radiation fins are provided on the outer frame to cool the heat generating device more efficiently.

Moreover, a blower according to the present invention is provided with radiation fins having a fan drive section and a thermal conductivity on the side of a fan, adjacent to a heat generating device, within an opening of a thermally conductive outer frame, and therefore the blower can be made small size.

In addition, an electronic equipment according to the present invention includes a casing housing a circuit board having a heat generating device mounted thereon and a heat conduction member for conducting heat of the heat generating device therein, an outer frame having a thermal conductivity and provided with a fan disposed in an opening thereof, the outer frame being attached to the heat conduction member, and radiation fins having thermal conductivity and being provided on the outer frame, so as to remove the heat of the generating device through the heat conduction member, the outer frame and the fins.

With the above construction, the heat of the heat generating device is not only conducted and removed by making use of the outer frame of the fan and the radiation fins in the fan drive section but also cooled by the fan, and therefore the heat of the heat generating device can be removed effectively, and accordingly the equipment incorporating the heat generating device can be made smaller size.

DETAILED DESCRIPTION OF THE PREFERRED EMBODIMENTS

Figure 1A:
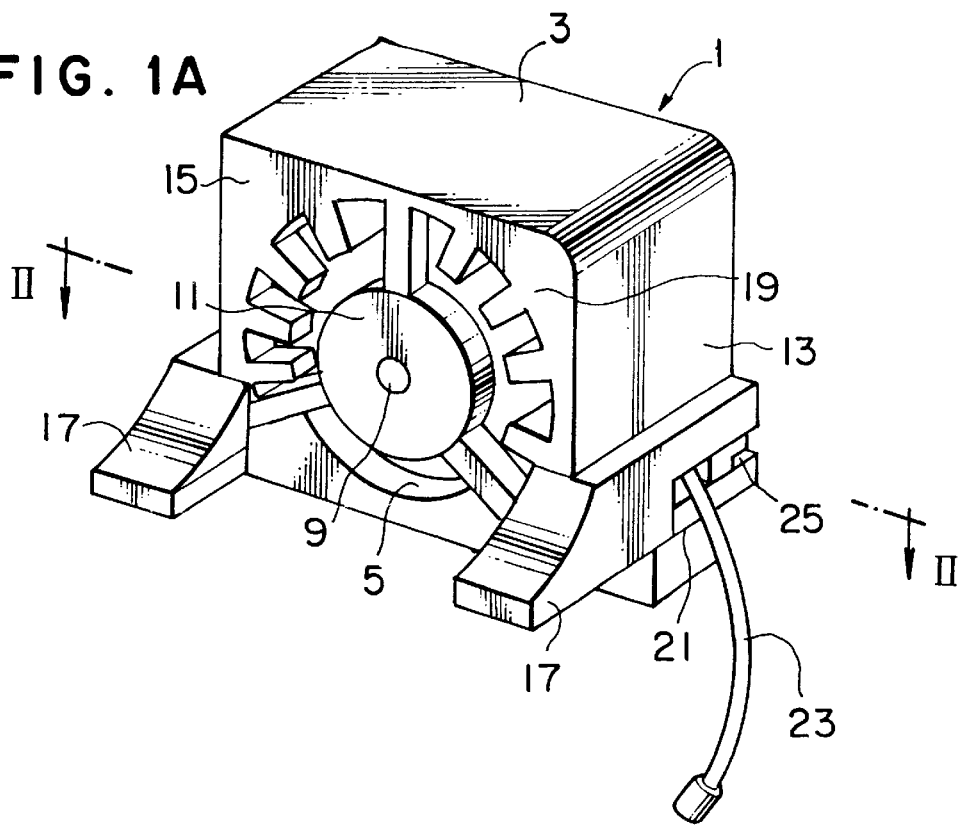
FIGS. 1A and 1B are perspective views of a blower according to the present invention.
Figure 1B:
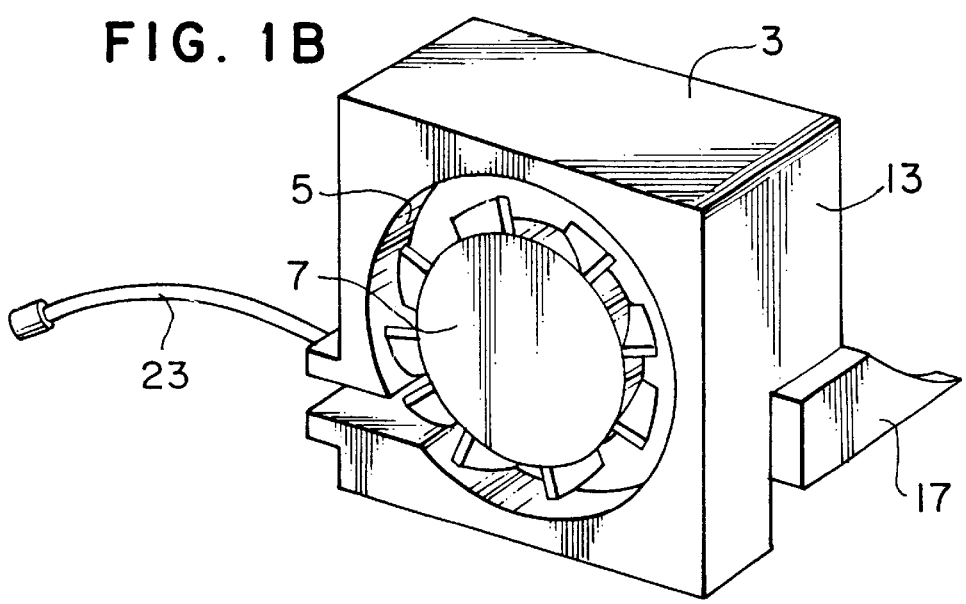

FIGS. 1A and 1B generally show a blower according to one embodiment of the present invention. FIG. 1A is a perspective view of the blower as viewed from the suction port side thereof, while FIG. 1B is a perspective view thereof from the exhaust port side thereof.

A blower 1 has an outer frame 3 made of a highly thermally conductive metal such as aluminum, copper or aluminum nitride. The outer frame 3 has an opening 5 in which a fan 7 is disposed. In the center of a suction port of the outer frame 3, a bearing portion 11 which supports a rotary shaft 9 of the fan 7 is formed integrally with the outer frame 3. On the suction port side of the outer frame 3, a pair of attaching portions 17, projecting from opposite side portions 13 of the outer frame 3 to extend beyond a suction surface 15, are formed integrally with the outer frame 3. In the vicinity of the suction port within the opening 5 of the outer frame 3, radiation fins 19 are formed integrally with the outer frame 3. The radiation fins 19 are arranged in the opening 5 thereof so as to surround the rotary shaft 9. One of the side portions 13 of the outer frame 3 is formed with a slit 21 through which a lead wire 23 for electric power source is led out. A lead holder 25 is inserted in the slit 21 to prevent the lead wire 23 from coming out of the slit 21. The radiation fins 19 may be formed separately from the outer frame 3 and fixed thereto by means of screws or the like.

Figure 2:
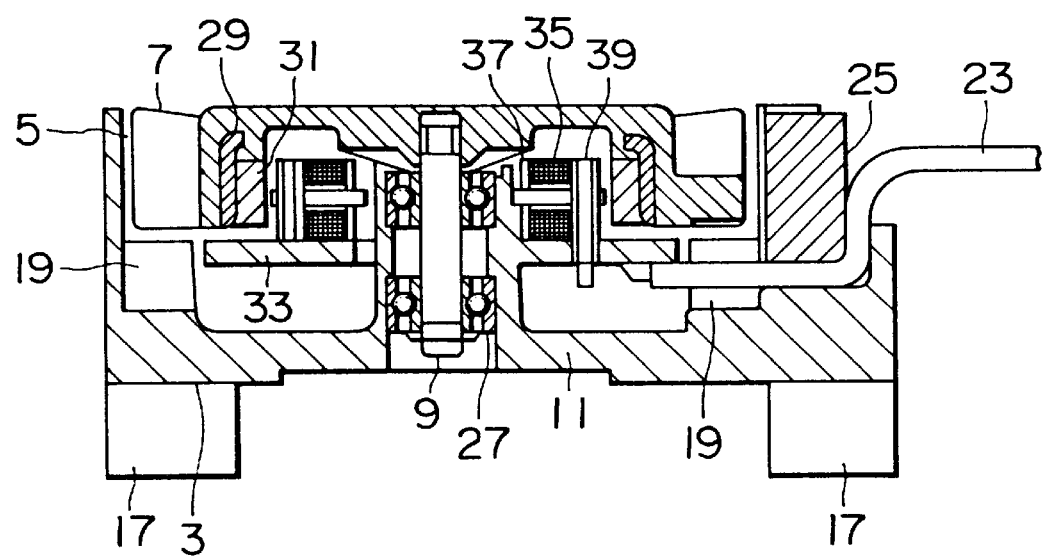
FIG. 2 is a sectional view taken along the line II—II of FIG. 1.

FIG. 2 is a sectional view taken along the line II—II of FIG. 1.

The rotary shaft 9 is fitted to the bearing portion 11 through ball bearings 27, and the fan 7 is attached to one end of the rotary shaft 9. A rotor yoke 29 and a magnet 31 are fixed to an inside of the fan 7. A stator core 37 is attached to the bearing portion 11 within the opening 5. A coil 35 is wound around a stator core 37 by way of an insulator 39 to which a base plate 33 of a fan-driving circuit is mounted. An insulator 39 is disposed between the coil 35 and the stator core 37. The rotor yoke 29, the magnet 31, the fan base plate 33, the coil 35 and the stator core 37 constitute a drive section for rotating the fan.

The radiation fins 19 are provided on the side of the blower 1 where the drive section of the fan 7 is arranged, and therefore the blower 1 can be made smaller. Further, the radiation fins 19 are provided in the vicinity of the suction port of the blower 1, and therefore heat dissipation can be performed efficiently.

Figure 3:
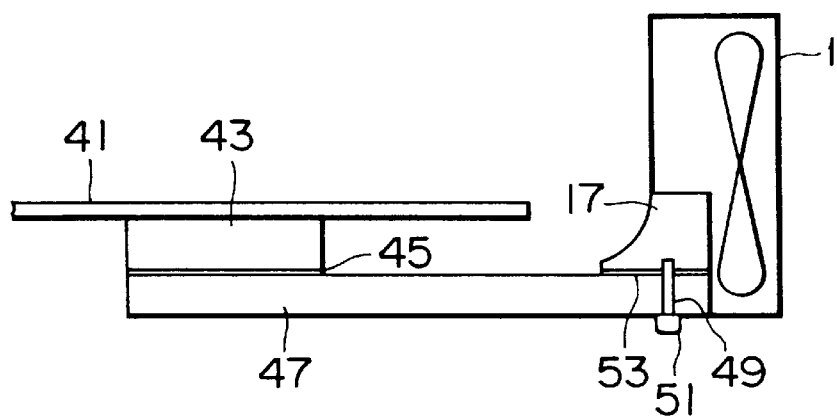
FIG. 3 is a sectional view showing a construction of a heat sink apparatus in accordance with the invention.

FIG. 3 shows a heat sink apparatus according to one embodiment of the present invention.

A micro-processor unit (hereinafter, referred to as MPU) 43, which is a heat generating device, is set on a lower surface of a printed circuit board 41. The heat generating device is not limited to the MPU but may be another semiconductor such as a power IC. The MPU 43 is mounted on the printed circuit board 41 at one surface thereof and thermally connected at the other surface thereof to a radiation board 47, which is a heat conduction member, through a radiation sheet 45 such as a silicon grease layer or a thermally conductive rubber sheet. Namely, the printed circuit board 41 and the radiation board 47 are fastened to each other with screws while leaving a predetermined space between them in such a manner that the heat of the MPU 43 is transferred to the radiation board 47. The radiation board 47 is made of a highly thermally conductive metal such as aluminum, copper or aluminum nitride. The radiation board 47 is formed at one end thereof with a mounting portion 49 to which the blower 1 is fixed. The attaching portion 17 of the blower 1 is fastened to the mounting portion 49 of the radiation board 47 by means of a screw 51. Namely, the blower 1 is fixed to the radiation board 47 in such a manner that the suction port of the blower 1 faces the MPU 43. A thermally conductive grease 53 is applied between the mounting portion 49 of the radiation board 47 and the attaching portion 49 of the radiation board 47 and the attaching portion 17 of the blower 1 so as to increase the strength of thermal connection. The mounting portion 49 of the radiation board 47 and the attaching portion 17 of the blower 1 may be fastened to each other by other means such as soldering. Further, it is also possible to form the radiation board 47 and the outer frame of the blower 1 into one body by means of die casting or the like.

Heat generated from the MPU 43 is transfered through the radiation board 47 to the outer frame 3 and the radiation fins 19 of the blower 1. The radiation board 47, the outer frame 3 and the radiation fins 19 form a heat conduction path while each serving as a radiator device per se, thereby cooling the MPU 43. The outer frame 3 and the radiation fins 19 of the blower 1 are forcedly cooled by the fan 7, so that the radiation of heat can be effectively performed. Further, air currents produced by the fan 7 reach the MPU 43 and the radiation board 47 as well, and therefore the efficiency of radiation of heat from the surface of the MPU 43 and the radiation board 47 can be enhanced.

It is advisable that the radiation board 47 be formed in the shape of a plate, however, it is also possible to form a heat conduction member by making use of a heat pipe or the like.

Figure 4:
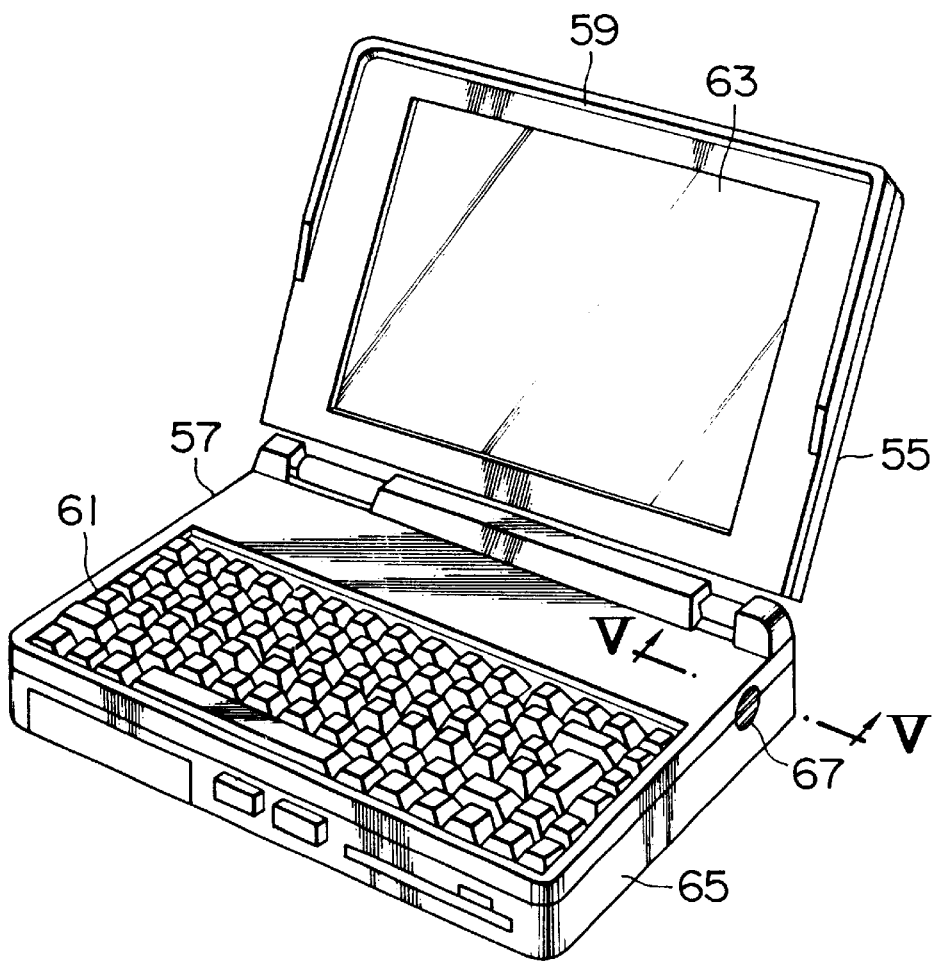
FIG. 4 is a perspective view of an electronic equipment to which the heat sink apparatus of the invention is applied.

FIG. 4 shows an electronic equipment according to one embodiment of the present invention.

A portable or mobile notebook personal computer 55 includes a base unit 57 which is a casing for housing a heat sink apparatus, and a display unit 59. The base unit 57 has a keyboard 61 on an upper surface thereof. The display unit 59 is connected to a rear portion of the upper surface of the base unit 57 in such a manner that it pivots freely with respect to the base unit 57. A liquid crystal display 63 is incorporated in the display unit 59. The base unit 57 is formed with an exhaust port 67 in one side surface 65 thereof.

This embodiment is a portable or mobile computer, however, the present the present invention is applicable to a desk-top computer, a word processor, a portable terminal equipment and so on.

Figure 5:
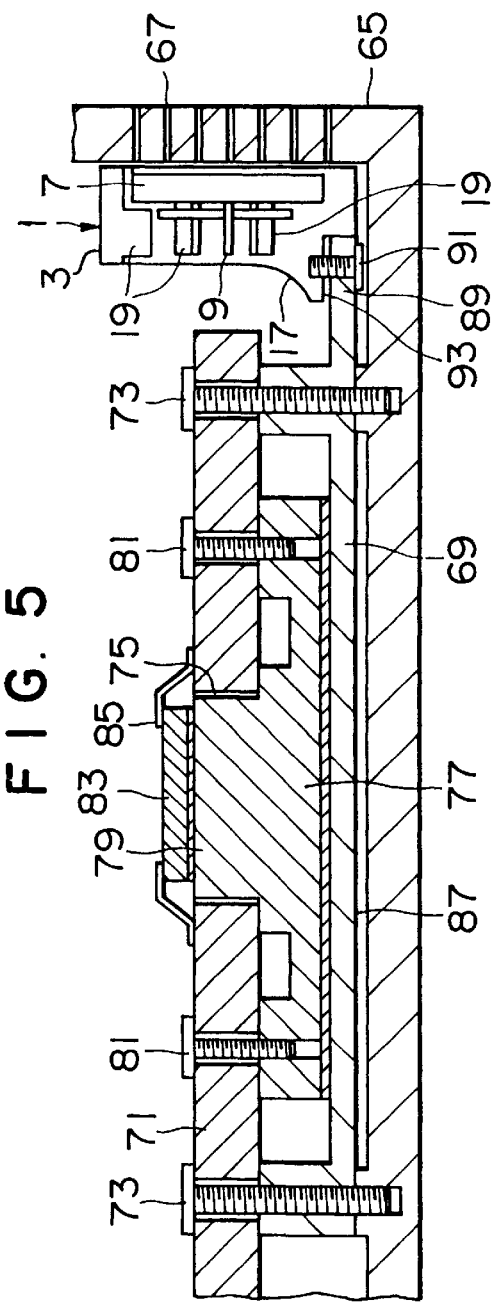
FIG. 5 is a sectional view taken along the line V—V of FIG. 4.
Figure 6:
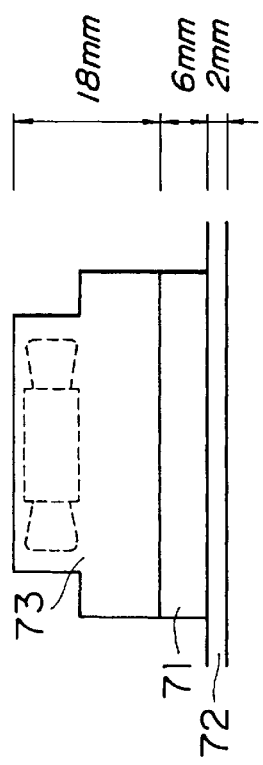
FIG. 6 is a schematic side view of a conventional heat sink having a built-in fan motor.

FIG. 5 is a sectional view taken along the line V—V of FIG. 4.

A radiation board 69 as a heat conduction member is put on a bottom surface of a base unit 57 which constitutes the casing. A printed circuit board 71 is disposed above the radiation board 69 leaving a predetermined space between them. Both the radiation board 69 and the printed circuit board 71 are fastened to the base unit 57 by means of screws 73.

The printed circuit board 71 is formed in a predetermined portion thereof with a through hole 75. A projection 79 of a heat transfer block 77 serving as a heat transfer member, is inserted in the through hole 75 from below a lower surface of the printed circuit board 71. The heat transfer block 77 is made of a highly thermally conductive metal such as an aluminum alloy. The heat transfer block 77 is fixed to the printed circuit board 71 by means of screws 81.

A semiconductor chip 83 of tape-carrier-package type, or tape automated bonding type, which is a heat generating device, is put on an upper surface of the projection 79 of the heat transfer block 77. The semiconductor chip 83 is fixed to the upper surface of the projection 79 by means of an electrically conductive bonding agent 85. A lower surface of the heat transfer block 77 is thermally connected to the radiation board 69 through a radiation sheet 87.

The radiation board 69 is provided at one end portion thereof, adjacent to the exhaust port 67, with a mounting portion 89 to which the attaching portion 17 of the blower 1 is fixed by means of a screw 91. A thermally conductive grease 93 is applied between the mounting portion 89 of the radiation board 69 and the attaching portion 17 of the blower 1 so as to enhance the efficiency of heat conduction between the mounting portion 89 and the attaching portion 17. The attaching portion 17 of the blower 1 is fixed to the mounting portion 89 of the radiation board 69, and therefore the suction port of the blower 1 faces the semiconductor chip 83 while the exhaust port of the blower 1 faces the exhaust port 67 of the base unit 57. Heat generated from the semiconductor chip 83 put on the upper surface of the printed circuit board 71 is transferred by the heat transfer block 77 to the lower surface side of the printed circuit board 71, and further transferred through the radiation sheet 87, the radiation board 69, the mounting portion 89 and the attaching portion 17 to the outer frame 3 and the radiation fins 19 of the blower 1. The radiation board 69 and the outer frame 3 and the radiation fins 19 of the blower 1 form a heat conduction path while each serves as a radiator per se, thereby cooling the semiconductor chip 83. The outer frame 3 and the radiation fins 19 are forcedly cooled by the fan 7, and therefore the radiation of heat can be effectively performed. Further, air currents produced by the fan 7 reach the semiconductor chip 83 and the radiation board 69 as well, and accordingly the efficiency of radiation of heat from the surfaces of the semiconductor chip 83 and the radiation board 69 can be enhanced.

In this embodiment, the heat transfer block 77 is inserted in the through hole 75, however, it is also possible to transfer the heat from the upper surface to the lower surface of the printed circuit board 71 by using a plated through hole alone. Further, the radiation board 69 as the heat conduction member is used in this embodiment, however it is also possible to transfer the heat to the blower by making use of a heat pipe or the like.

As has been described above, according to the present invention, the radiation fins are provided on the fan drive section side, and therefore the blower can be made small-sized. Further, the outer frame of the blower is made of a thermally conductive material and thermally connected to the heat conduction member, and therefore it is possible to materialize a heat sink apparatus and an electronic equipment which are compact and achieve high efficiency of heat radiation.

What is claimed is:

1. A blower comprising:
a thermally conductive outer frame having a suction port and an exhaust port;
a fan disposed in a vicinity of said exhaust port such that said fan has a suction port side facing said suction port;
a bearing section that supports said fan and that is provided integrally with said outer frame and is connected to said outer frame by a plurality of support members;
a drive section disposed on said suction port side of said fan for rotating said fan;
fins provided integrally with said outer frame in a vicinity of said suction port; and
a pair of attachment portions that are provided at opposite sides of the outer frame spaced with a predetermined dimension from a bottom end portion of the outer frame, wherein:
said support members are located in said vicinity of said suction port,
said fins are located between said support members, and an outer-configuration size of the blower is 30 mm or less.

2. A blower according to claim 1, wherein:
said drive section comprises a rotary shaft projecting toward said suction port; and said fins are disposed to surround said rotary shaft.

3. Electronic equipment comprising a blower according to claim 1 for cooling said electronic equipment.

4. The blower according to claim 1 wherein said fan is disposed at said exhaust port.

5. The blower according to claim 1 wherein said fins are provided at said suction port inside of said outer frame.

6. The blower according to claim 1 wherein said fan rotates about an axis disposed in a direction of air discharge of said blower.

7. The blower according to claim 1 wherein said outer frame includes slits at a side portion thereof.

8. The blower according to claim 1 wherein said outer configuration size is in a direction of air flow from said suction port to said exhaust port.

9. A blower comprising:
a thermally conductive outer frame having a suction port and an exhaust port;
a fan having a rotary shaft and disposed in a vicinity of said exhaust port such that said fan has a suction port side facing said suction port;
a bearing section provided integrally with said outer frame for bearing said rotary shaft;
a drive section disposed on said suction port side of said fan for rotating said fan;
fins provided integrally with said outer frame in a vicinity of said suction port; and
a pair of attachment portions that are provided at opposite sides of the outer frame spaced with a predetermined dimension from a bottom end portion of the outer frame, wherein
portions of said bearing section and said fins are disposed in a plane that is substantially perpendicular to a direction of air flow between the suction port and the exhaust port, and
an outer-configuration size of the blower is 30 mm or less.

10. A blower according to claim 9, wherein said fins surround said bearing portion.

11. A blower according to claim 9, wherein said fins and said fan are disposed in series in a direction of said rotary shaft.

12. Electronic equipment comprising a blower according to claim 9 for cooling said electronic equipment.

13. The blower according to claim 9 wherein said fan is disposed at said exhaust port.

14. The blower according to claim 9 wherein said bearing section is made of heat conductive material.

15. The blower according to claim 9 wherein said fins are provided at said suction port inside of said outer frame and at a peripheral portion of the bearing section of said fan.

16. The blower according to claim 9 wherein said fan rotates about an axis disposed in a direction of air discharge of said blower.

17. The blower according to claim 9 wherein said outer frame includes slits at a side portion thereof.

18. The blower according to claim 9, wherein said outer configuration size is in a direction of air flow from said suction port to said exhaust port.

* * * * *